United States Patent
Adem et al.

(10) Patent No.: US 7,468,296 B1
(45) Date of Patent: Dec. 23, 2008

(54) THIN FILM GERMANIUM DIODE WITH LOW REVERSE BREAKDOWN

(75) Inventors: Ercan Adem, Sunnyvale, CA (US); Matthew Buynoski, Palo Alto, CA (US); Robert Chiu, San Jose, CA (US); Bryan Choo, Mountain View, CA (US); Calvin Gabriel, Cupertino, CA (US); Joong Jeon, Cupertino, CA (US); David Matsumoto, San Jose, CA (US); Jeffrey Shields, Sunnyvale, CA (US); Bhanwar Singh, Morgan Hill, CA (US); Winny Stockwell, Redwood City, CA (US); Wen Yu, Fremont, CA (US)

(73) Assignees: Spansion LLC, Sunnyvale, CA (US); Advanced Micro Devices Inc., Sunnyvale, CA (US)

( * ) Notice: Subject to any disclaimer, the term of this patent is extended or adjusted under 35 U.S.C. 154(b) by 360 days.

(21) Appl. No.: 11/290,787

(22) Filed: Nov. 30, 2005

(51) Int. Cl.
*H01L 21/8234* (2006.01)
*H01L 27/10* (2006.01)

(52) U.S. Cl. .............. 438/237; 438/328; 438/600; 257/202; 257/208

(58) Field of Classification Search .......... 257/212, 257/288, 289, 202, 208, 210, 211; 438/141, 438/238, 237, 328, 598, 600, 128
See application file for complete search history.

(56) References Cited

U.S. PATENT DOCUMENTS

| 4,203,123 | A  | * | 5/1980  | Shanks ............... 257/2 |
| 2005/0121742 | A1 | * | 6/2005  | Petti et al. ............ 257/530 |
| 2006/0249753 | A1 | * | 11/2006 | Herner et al. ......... 257/202 |

* cited by examiner

*Primary Examiner*—Kevin M Picardat

(57) ABSTRACT

In fabricating an electronic structure, a substrate is provided, and a first barrier layer is provided on the substrate. A germanium thin film diode is provided on the first barrier layer, and a second barrier layer is provided on the germanium thin film diode. A memory device is provided over and connected to the second barrier layer.

18 Claims, 10 Drawing Sheets

US 7,468,296 B1

THIN FILM GERMANIUM DIODE WITH LOW REVERSE BREAKDOWN

BACKGROUND OF THE INVENTION

1. Technical Field

This invention relates generally to diodes, and more particularly, to a low reverse breakdown diode for use in a memory array.

2. Background Art

Generally, memory devices associated with computers and other electronic devices are employed to store and maintain information for the operation thereof. Typically, such a memory device includes an array of memory cells, wherein each memory cell can be accessed for programming, erasing, and reading thereof. Each memory cell maintains information in an "off" state or an "on" state, also referred to as "0" and "1" respectively, which can be read during the reading step of that memory cell.

As such electronic devices continue to be developed and improved, the amount of information required to be stored and maintained continues to increase. FIG. 1 illustrates a type of memory cell known as a nanoscale resistive memory cell 30, which includes advantageous characteristics for meeting these needs. The memory cell 30 includes, for example, a Cu electrode 32, a superionic layer 34 such as $Cu_2S$ on the electrode 32, an active layer 36 such as a polymer on the $Cu_2S$ layer 34, and a Ti electrode 38 on the active layer 36. Initially, assuming that the memory cell 30 is unprogrammed, in order to program the memory cell 30, a negative voltage is applied to the electrode 38, while the electrode 32 is held at ground, so that an electrical potential $V_{pg}$ (the "programming" electrical potential) is applied across the memory cell 30 from a higher to a lower potential in the direction from electrode 32 to electrode 38 (see FIG. 2, a plot of memory cell current vs. electrical potential applied across the memory cell 30). This potential is sufficient to cause copper ions to be attracted from the superionic layer 34 toward the electrode 38 and into the active layer 36, causing the active layer 36 (and the overall memory cell 30) to be in a low-resistance or conductive state (A). Upon removal of such potential (B), the copper ions drawn into the active layer 36 during the programming step remain therein, so that the active layer 36 (and memory cell 30) remain in a conductive or low-resistance state.

In order to erase the memory cell (FIG. 2), a positive voltage is applied to the electrode 38, while the electrode 32 is held at ground, so that an electrical potential $V_{er}$ (the "erase" electrical potential) is applied across the memory cell 30 from a higher to a lower electrical potential in the reverse direction. This potential causes current to flow through the memory cell in the reverse direction (C), and is sufficient to cause copper ions to be repelled from the active layer 36 toward the electrode 32 and into the superionic layer 34, in turn causing the active layer 36 (and the overall memory cell 30) to be in a high-resistance or substantially non-conductive state. This state remains upon removal of such potential from the memory cell 30.

FIG. 2 also illustrates the read step of the memory cell 30 in its programmed (conductive) state and in its erased (nonconductive) state. An electrical potential $V_r$ (the "read" electrical potential) is applied across the memory cell 30 from a higher to a lower electrical potential in the same direction as the electrical potential $V_{pg}$. This electrical potential is less than the electrical potential $V_{pg}$ applied across the memory cell 30 for programming (see above). In this situation, if the memory cell 30 is programmed, the memory cell 30 will readily conduct current (level L1), indicating that the memory cell 30 is in its programmed state. If the memory cell 30 is erased, the memory cell 30 will not conduct current (level L2), indicating that the memory cell 30 is in its erased state.

FIGS. 3, 4 and 5 illustrate a memory cell array 40 which incorporates memory cells 30 of the type described above. As illustrated in FIG. 3, the memory cell array 40 includes a first plurality 42 of parallel conductors (bit lines) $BL_0$, $BL_1$, . . . $BL_n$, and a second plurality 44 of parallel conductors (word lines) $WL_0$, $WL_1$, . . . $WL_n$ overlying and spaced from, orthogonal to, and crossing the first plurality of conductors 42. A plurality of memory cells 30 of the type described above are included, each associated with a select diode 50 having a (forward) threshold $V_t$ and a (reverse) breakdown voltage $V_b$, to form a memory cell-diode structure. (It will be understood that while a particular type of memory cell is shown and described, other types of suitable memory cells can be used). Each memory cell 30 is connected in series with a select diode 50 between a conductor BL of the first plurality 42 thereof and a conductor WL of the second plurality 44 thereof at the intersection of those conductors, with the diode 50 oriented in a forward direction from the conductor BL of the first plurality 42 thereof to the conductor WL of the second plurality 44 thereof. For example, as shown in FIG. 3, memory cell $30_{00}$ and diode $50_{00}$ in series connect conductor $BL_0$ of the first plurality of conductors 42 with conductor $WL_0$ of the second plurality of conductors 44 at the intersection of those conductors $BL_0$, $WL_0$, memory cell $30_{10}$ and diode $50_{10}$ in series connect conductor $BL_1$ of the first plurality of conductors 42 with conductor $WL_0$ of the second plurality of conductors 44 at the intersection of those conductors $BL_1$, $WL_0$, etc.

In order to program a selected memory cell (FIG. 3), for example selected memory cell $30_{00}$, the voltage applied to the conductor $BL_0$ is selected as $(V_{pg}+V_t)$ greater than the voltage (0) applied to the conductor $WL_0$, where $V_{pg}$ is as defined above and $V_t$=(forward) threshold voltage of diode $50_{00}$. Additionally, this same voltage $V_{pg}+V_t$ is applied to each of the conductors WL1, . . . $WL_n$, and zero voltage is applied to each of the conductors BL1, . . . $BL_n$. This results in zero potential being applied across each of the memory cell-diode structures (other than the selected memory cell $30_{00}$ and diode $50_{00}$ structure) connected to the conductor $BL_0$ and the conductor $WL_0$. Each of the other memory cell-diode structures has applied thereacross, from higher to lower potential in the reverse direction of the diode 50, an electrical potential which is equal to $V_{pg}+V_t$. This electrical potential is less than the breakdown voltage $V_b$ of the diode 50, and thus no current flows through the associated memory cell. Thus, the incorporation of the diodes 50 allows one to properly select and program a memory cell, without disturbing any of the other memory cells in the array.

In order to erase a selected memory cell (FIG. 4), for example selected memory cell $30_{00}$, the voltage applied to the conductor $WL_0$ is $(V_{er}+V_b)$ greater than the voltage (0) applied to the conductor $BL_0$, where $V_{er}$ is as defined above and $V_b$=(reverse) breakdown voltage of diode $50_{00}$. Additionally, a voltage of for example $0.5(V_{pg}+V_t)$ is applied to each of the conductors WL1, . . . $WL_n$, and each of the conductors BL1, . . . $BL_n$. This results a potential of $0.5(V_{pg}+V_t)$ being applied across each of the diode-memory cell structures (other than the selected memory cell $30_{00}$ and diode $50_{00}$ structure) connected to the conductor $BL_0$ and the conductor $WL_0$, from higher to lower potential in the reverse direction of the diode 50. This electrical potential $0.5(V_{pg}+V_t)$ is less than the breakdown voltage $V_b$ of the diode 50, and thus no current will flow through the associated memory cell. Each of the other memory cell-diode structures has applied thereacross an electrical potential of zero. Similar to the above, the incorporation of the diodes 50 allows one to properly select and erase a memory cell, without disturbing any of the other memory cells in the array.

In order to read a selected memory cell (FIG. 5), for example selected memory cell $30_{00}$, the voltage applied to the conductor $BL_0$ is $(V_r+V_t)$ greater than the voltage (0) applied to the conductor $WL_0$, where $V_r$ is as defined above and $V_t$=threshold voltage of diode $50_{00}$). Additionally, a voltage of $V_r+V_t$ is applied to each of the conductors $WL1, \ldots WL_n$, and zero voltage is applied to each of the conductors $BL1, \ldots BL_n$. This results in zero potential applied across each of the memory cell-diode structures (other than the selected memory cell $30_{00}$ and diode $50_{00}$ structure) connected to the conductor $BL_1$ and $WL_0$. Each of the other memory cell-diode structures has applied thereacross, from higher to lower potential in the reverse direction of the diode 50, an electrical potential which is equal to $V_r+V_r$. This potential $V_r+V_t$ is less than the breakdown voltage of the diode 50, so that no current passes through the associated memory cell. Thus, the incorporation of the diodes 50 allows one to properly select and read a memory cell, without disturbing or otherwise influencing any of the other memory cells in the array.

It is to be noted that in order to achieve erasing of a selected memory cell, current must be conducted through the selected memory cell, and in order to achieve this conduction of current, the diode associated therewith must be in breakdown. Ideally, such a diode would have a low threshold voltage (forward direction of the diode), and a low breakdown voltage (reverse direction of the diode), to allow rapid and effective programming, reading, erasing of a selected cell with relatively low electrical potentials applied thereto, so that a low potential power supply can be used.

Typically, the diodes in an array of this type are built on the same level as the peripheral circuitry and memory devices, where space is limited. This causes problems in laying out the overall device and causes the overall device area to be larger than is desirable.

Therefore, what is needed is an approach wherein proper forward and reverse diode characteristics are achieved in an overall array wherein space is conserved.

DISCLOSURE OF THE INVENTION

Broadly stated, in the present method of fabricating an electronic structure, a substrate is provided, a thin film diode comprising germanium is provided over the substrate and a memory device is provided over the substrate and connected to the diode.

Broadly stated, the present electronic structure comprises a substrate, a thin film diode comprising germanium over the substrate, and a memory device over and connected to the diode.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 1:
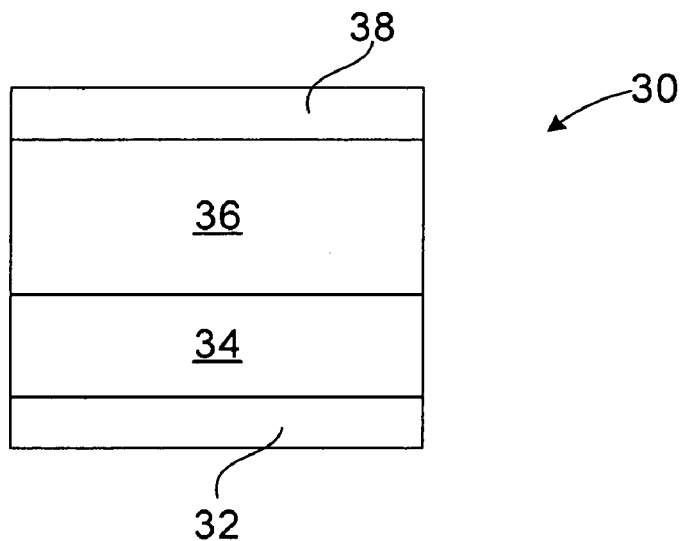
FIG. 1 is a cross-sectional view of a typical resistive memory cell.
Figure 2:
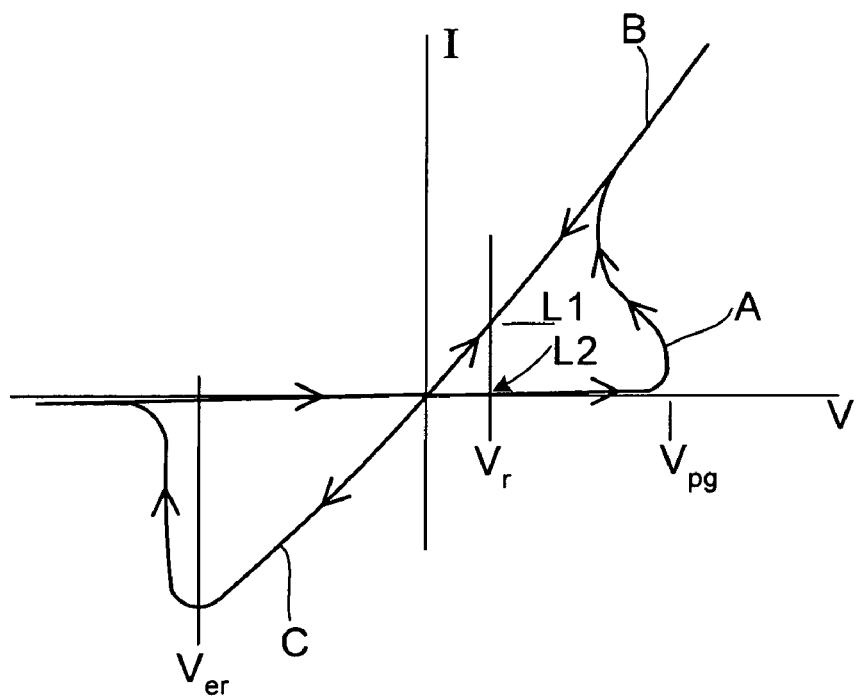
FIG. 2 is a plot of current vs. voltage in the programming, reading and erasing of the memory cell of FIG. 1.
Figure 3:
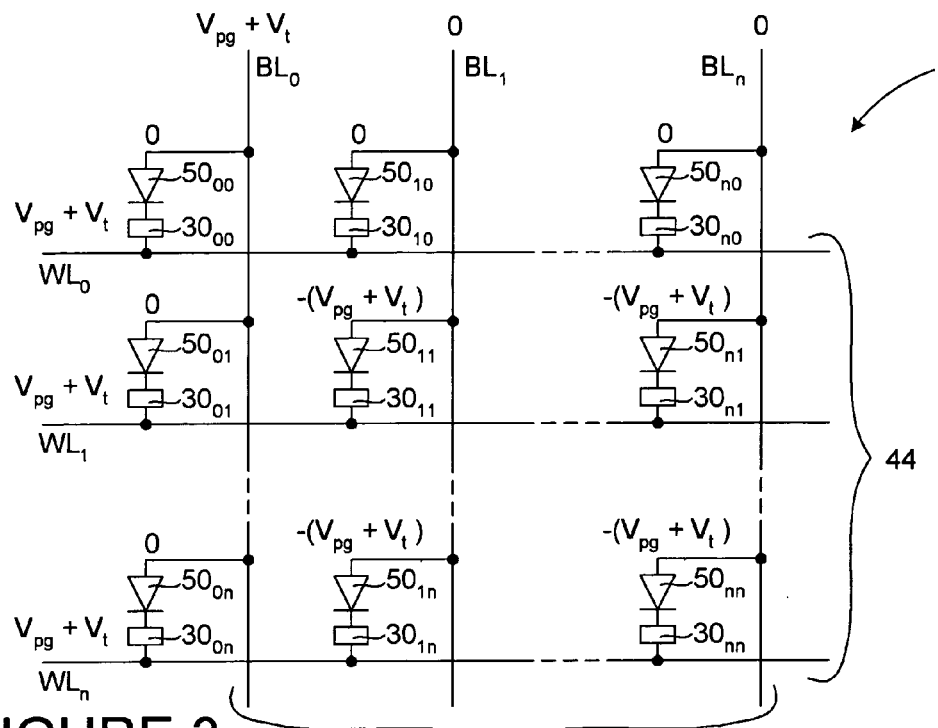
FIG. 3 is a schematic illustration of a memory array which includes memory cells in accordance with FIG. 1, illustrating programming of a selected memory cell.
Figure 4:
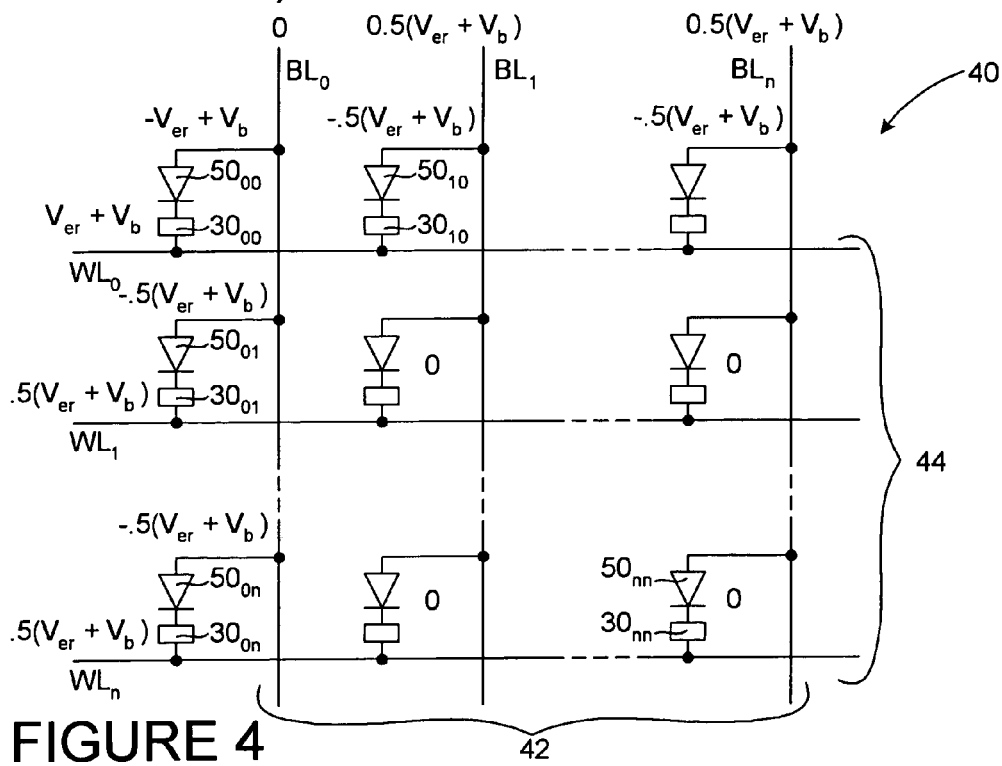
FIG. 4 is a schematic illustration of a memory array which includes memory cells in accordance with FIG. 1, illustrating erasing of a selected memory cell.
Figure 5:
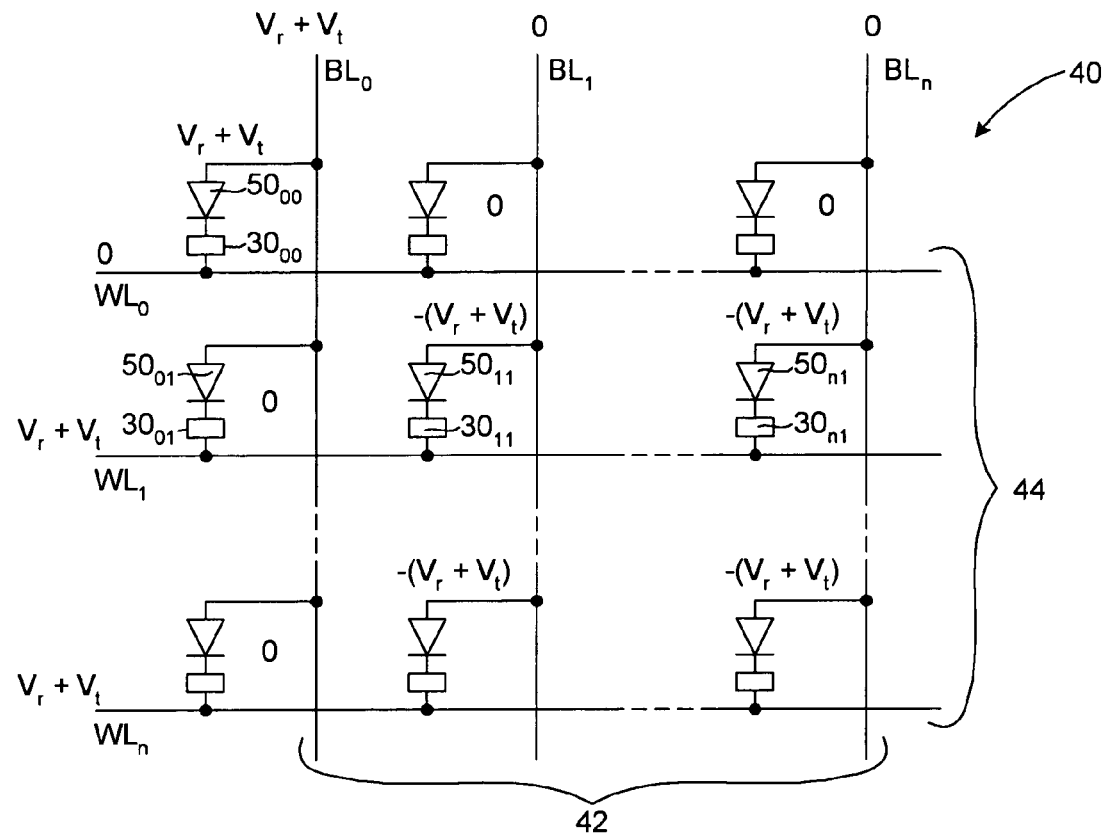
FIG. 5 is a schematic illustration of a memory array which includes memory cells in accordance with FIG. 1, illustrating reading of a selected memory cell.
Figure 6:
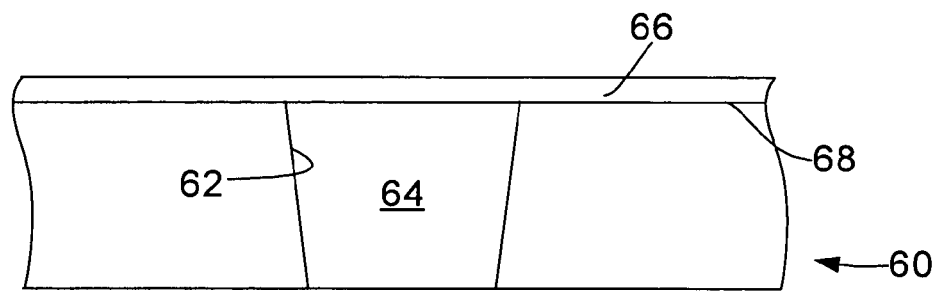
FIGS. 6-16 illustrate process steps in fabricating the structure of the present invention.

As illustrated in FIG. 6, a substrate 60 is provided which may contain semiconductor and/or dielectric material so as to include, for example, peripheral circuitry. The substrate 60 includes a via 62 which contains an interconnect in the form of a copper plug 64, it being understood that the copper plug 64 is one of many in the substrate 60. The copper plug 64 (and other copper plugs formed in the overall device) may be formed within a thin barrier layer (not shown) so as to limit copper diffusion into adjacent material.

Next, and with continued reference to FIG. 6, a metal barrier layer 66 is deposited over the substrate 60. In this particular embodiment, the material of the metal barrier layer is tungsten, which is deposited using a thin adhesion layer 68 (for example Ta or Ti) provided on the substrate 60. This step may be undertaken by physical vapor deposition (PVD), i.e., sputtering, or chemical vapor deposition (CVD).

Figure 7:
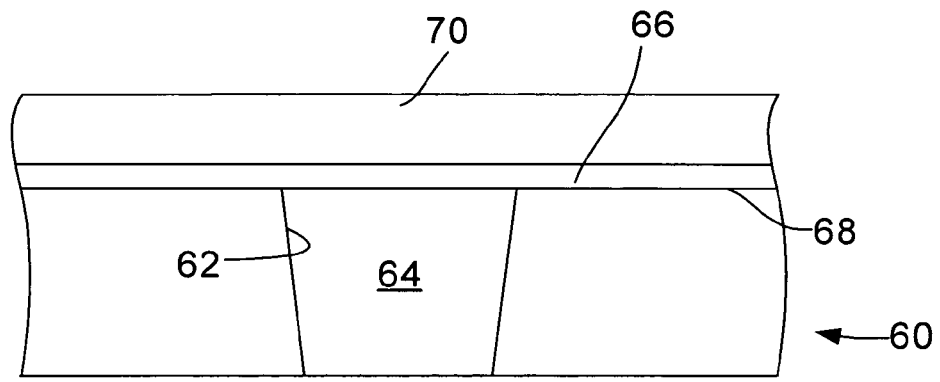

With reference to FIG. 7, a germanium layer 70 is then deposited on the barrier layer 66. This step may be undertaken by PVD or CVD processing. For efficiency in processing, the vacuum applied during the deposition of the barrier layer 66 continues unbroken through the deposition of the germanium layer 70, to provide good contact between the germanium layer 70 and the barrier layer 66 (i.e., no oxide between barrier layer 66 and germanium 70) and to provide high manufacturing efficiency (deposition of barrier layer 66 and germanium layer 70 done in one continuous operation in one multi-chamber tool).

Figure 8:
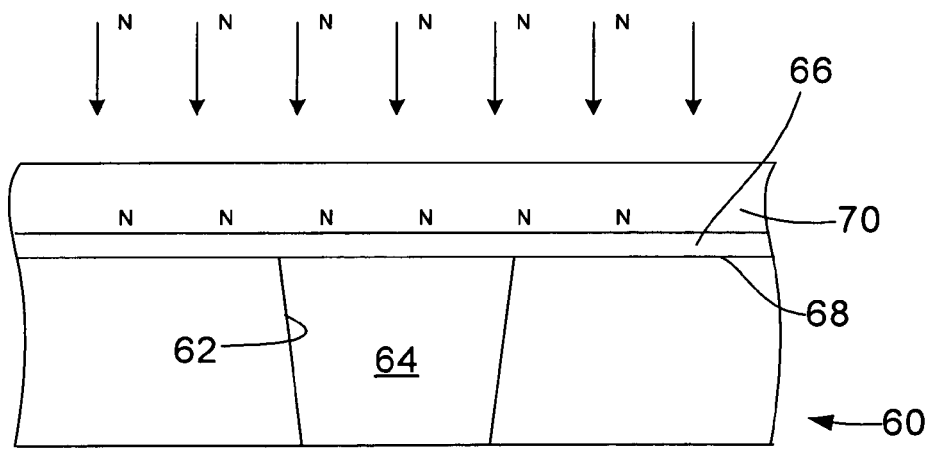

As illustrated in FIG. 8, an n type implant into the germanium layer 70 is undertaken, in this embodiment using arsenic, at a dose of $1E14$-$1E15/cm^2$, and at an energy level selected to place the arsenic-implanted peak approximately 100 angstroms above the interface of the barrier layer 66 and the germanium layer 70.

Figure 9:
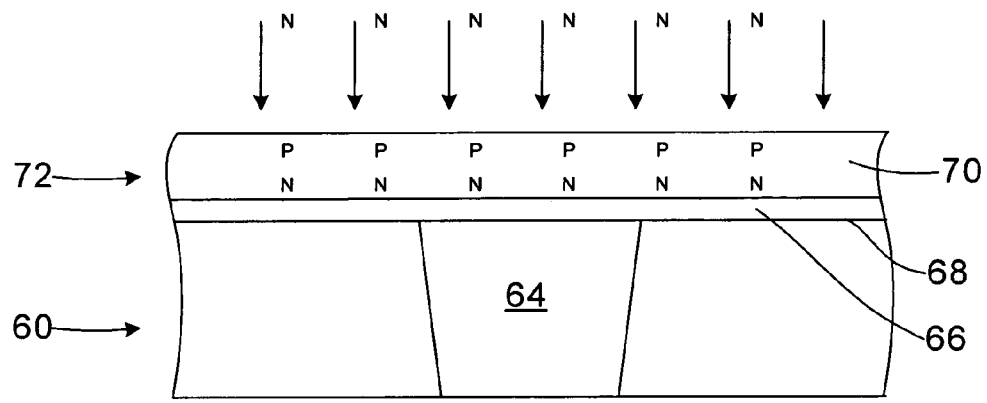

Next, and with reference to FIG. 9, a p type implant into the germanium layer 70 is undertaken, in this embodiment using boron, again at a dose of 1E14-1E15/cm², and at an energy level selected to place the boron-implanted peak approximately 100 angstroms below the top surface of the germanium layer 70. This energy may in fact be quite low, i.e., for example, 0.5-5 KeV. With the implants so situated, the germanium layer 70 forms a thin film p-i-n diode 72.

Figure 10:
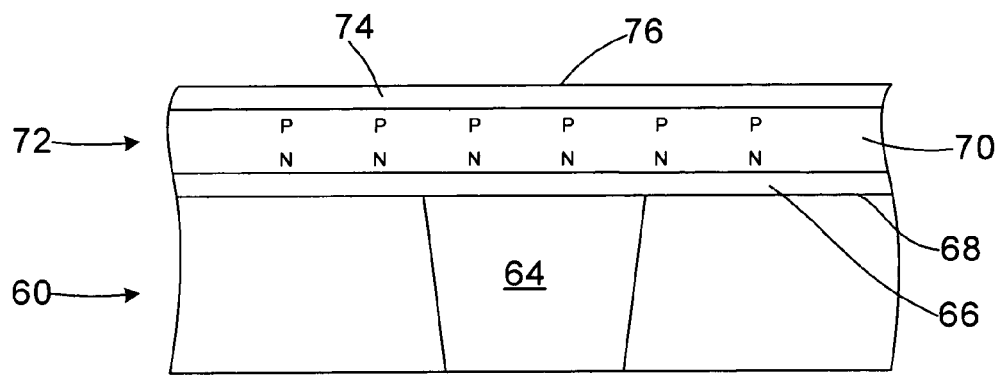

With reference to FIG. 10, after the exposed surface of the germanium layer 70 is sputter etched to remove any oxide which may have formed thereon, a metal barrier layer 74, in this embodiment tungsten, is deposited (by PVD or CVD) directly on and in contact with the germanium layer 70. Adhesion between the tungsten barrier layer 74 and germanium layer 70 is promoted by keeping the tungsten layer 74 relatively thin, i.e., for example 100-200 angstroms thick.

The tungsten barrier layer 66 provides several advantages. This layer 66 provides a barrier between the copper plug 64 and the germanium which, if they were in contact with each other, would react strongly at the temperatures required in further processing sequences. In addition, the barrier layer 66 provides a bottom contact for the germanium diode 72 which will not each intermetallically react with the germanium or diffuse into the germanium during processing. The upper tungsten barrier layer 66, unlike other materials, will not react with the germanium at the temperature required for dopant activation (approximately 500° C., as described below). The tungsten barrier layer 74 provides similar advantages.

As germanium and tungsten are highly reflective, a TiN layer 76 is deposited on the tungsten barrier layer 74 to reduce reflection for subsequent masking steps. This TiN layer 76 may be for example 100-600 angstroms thick, depending on the wavelength of the light used in further processing and the choice of film thicknesses.

The p-i-n configuration of the germanium diode 72 allows for a wide high-field zone in the center of the germanium layer 70 to enhance avalanche carrier multiplication and reduce dopant-induced scattering in the high field region. Both these characteristics help to keep the reverse breakdown voltage of the diode 72 low. In addition, the choice itself of germanium for the diode material helps to keep the reverse breakdown voltage of the diode 72 low, since germanium has a significantly lower band gap than the more commonly used silicon. The thickness of the germanium is dependent on the diode voltage levels required. For example, for approximately 2.5V reverse breakdown, the thickness of the germanium layer can be approximately 0.1-0.2 µm. It will be understood that the positioning of the n type and p type dopants in the germanium layer 70 may be reversed, depending on the chosen operating characteristics of the diode 72.

Figure 11:
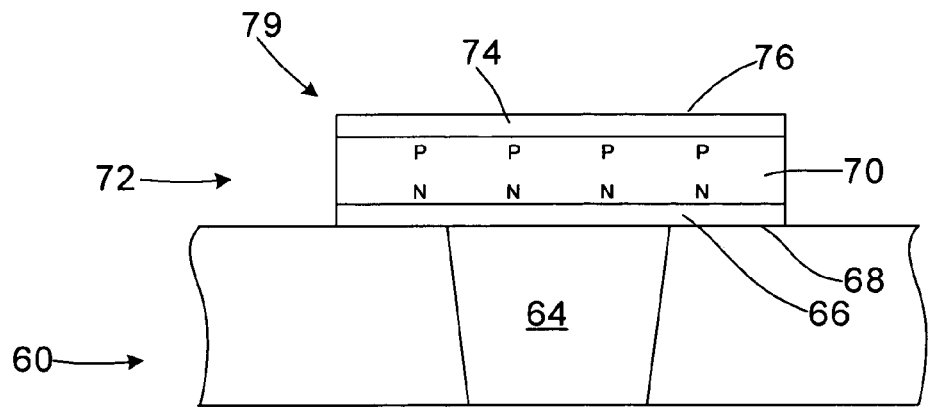

Standard lithography techniques are used to define the shape of the barrier layers 66, 74 and germanium diode 72 (FIG. 11). As will be seen, a number of particular elements must be etched, i.e., TiN antireflective coating 76, tungsten barrier layer 74, p (or n) doped germanium, intrinsic germanium, n (or p) doped germanium, tungsten barrier layer 66, and Ti adhesion layer 68. In furtherance thereof, chlorine chemistry is used for etching the germanium portions, stopping on the tungsten barrier layer 66. The etch (tungsten barrier layer 66) is then completed with fluorine chemistry to avoid an attack on exposed copper in the substrate 60. In particular, if it was necessary to use chlorine chemistry to etch the barrier layer 66, chlorine-containing ions would be implanted into underlying films, including exposed copper. Copper is readily corroded by water, with chlorine residue acting as a catalyst, so even small amounts of chlorine embedded in the copper could damage the copper. Since tungsten can readily be etched using fluorine chemistry, this problem is avoided.

The resulting structure is then annealed in a non-oxidizing ambient at a temperature of 500° C. to activate the dopants and to recrystallize the germanium (amorphous from both original deposition and implants). The choice of germanium over silicon provides the further advantage that recrystallization and activation of dopants occurs at a lower temperature than for silicon.

Figure 12:
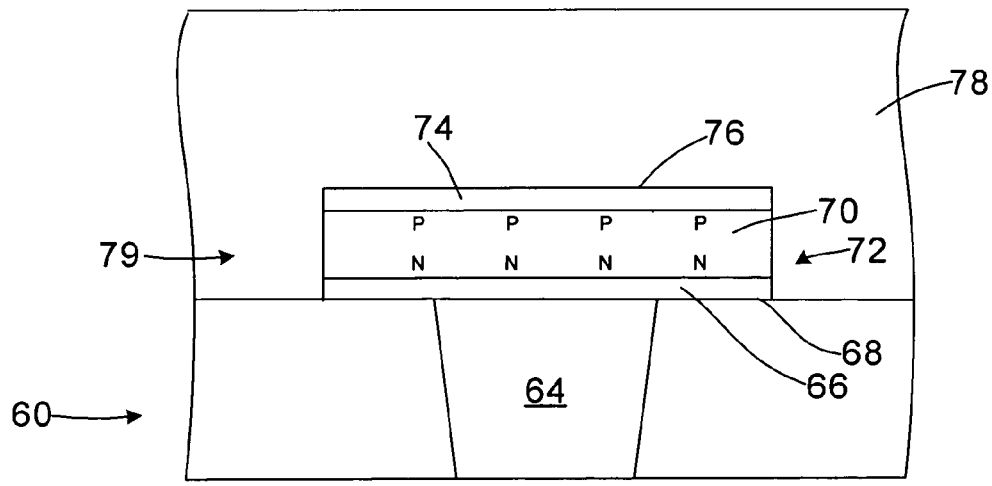
Figure 13:
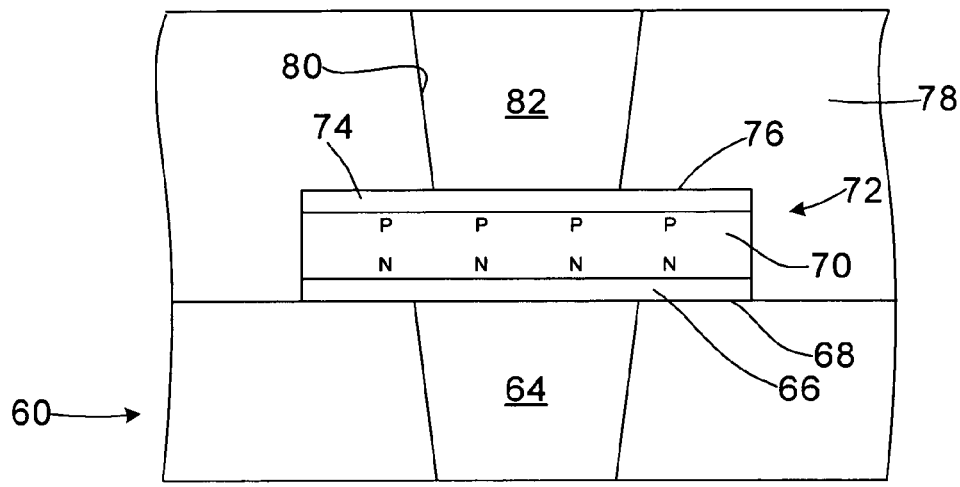
Figure 14:
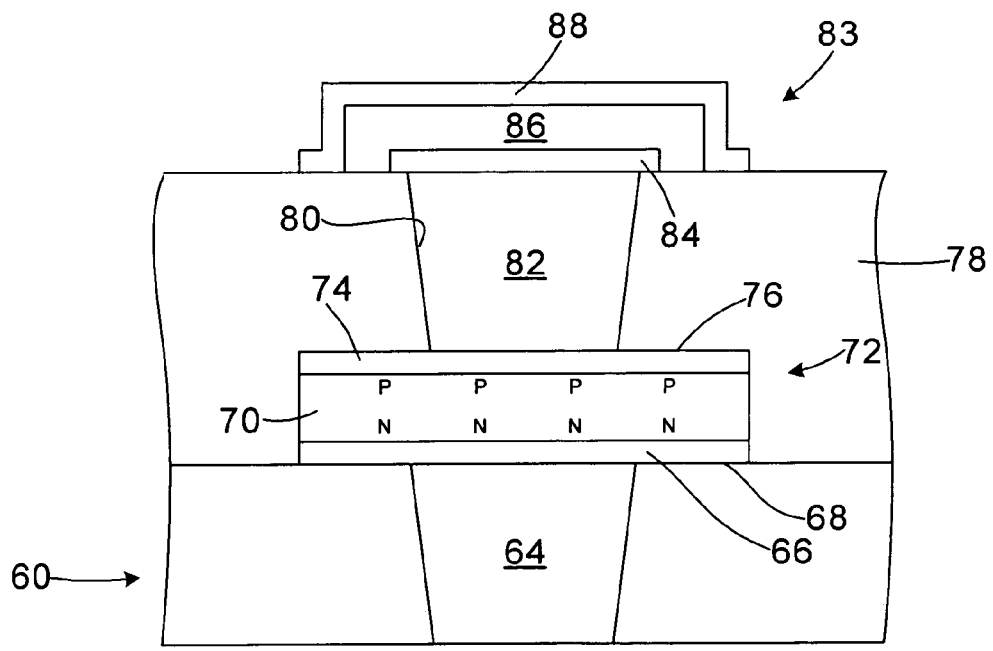
Figure 15:
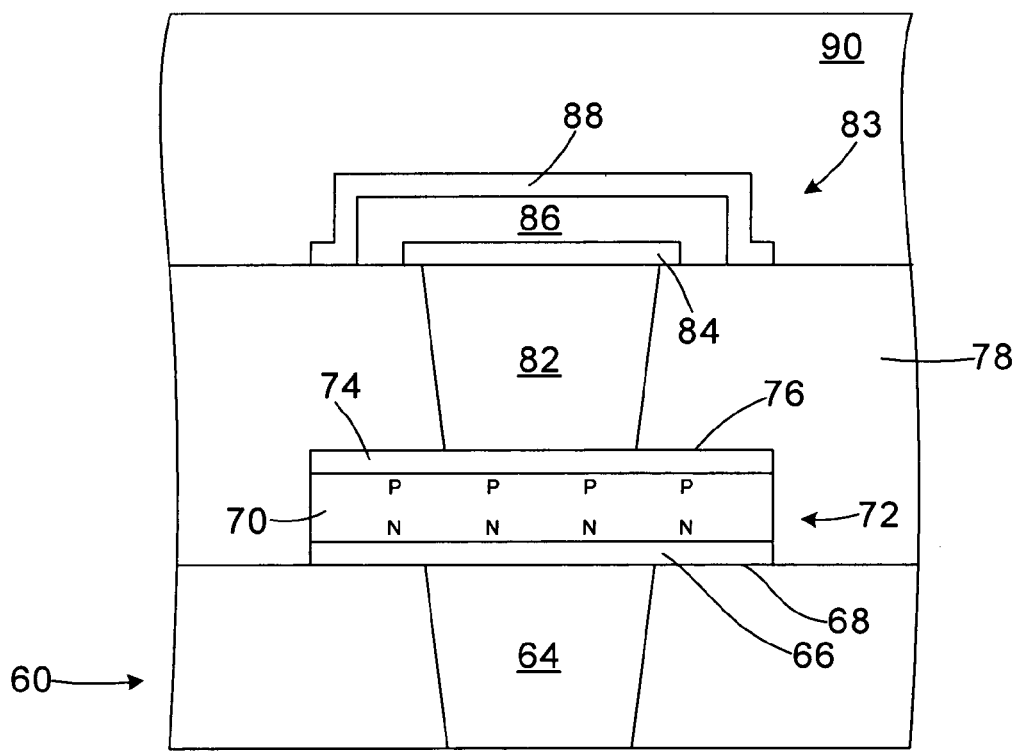
Figure 16:
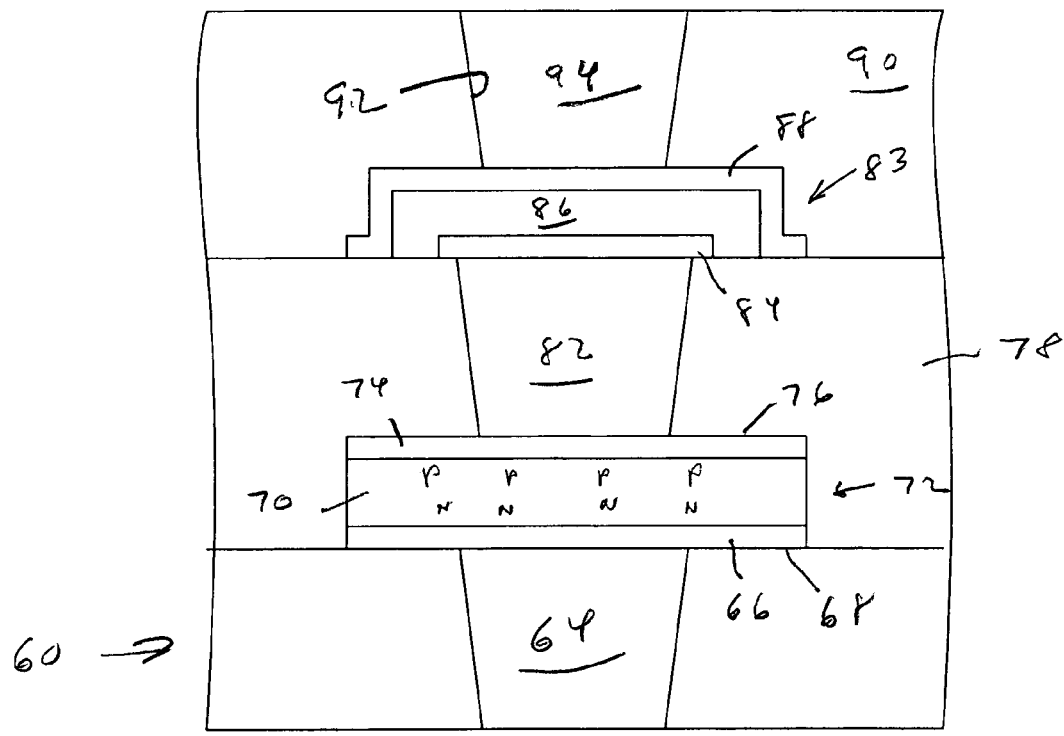

A suitable dielectric 78, in this embodiment silicon dioxide, is used to cover and enclose the etched and annealed stack 79 (FIG. 12). A planarization polish step is undertaking to smooth the surface of the silicon dioxide 78 over the stack 79. Referring to FIG. 13, using appropriate masking, vias 80 are etched in the silicon dioxide 78, stopping on the TiN layer 76. The vias are filled with copper 82 and the resulting structure is polished in a standard manner. Thereafter, a memory device 83, for example as described above, can be provided over and connected in series with the diode 72 through the barrier layer 74 (FIG. 14). In furtherance thereof, the copper plug 82 acts as the bottom electrode of the memory device 83, with a passive layer 84 formed on the electrode 82, an active layer 86 formed on the passive layer 84, and a metal layer 88 (top electrode) formed on the active layer 86. Then (FIG. 15), a suitable dielectric 90 such as silicon dioxide is used to cover the resulting structure. Using appropriate masking (FIG. 16), a via 92 is etched in the silicon dioxide 90, over the metal layer 88, and stopping at the metal layer 88. The via 92 is filled with copper to form a copper plug 94.

While in the above description the memory device 83 is above the diode 72, it will be understood that the diode 72 may be provided above the memory device 83.

The diode-memory device stack can be as high as desired, above and removed from the substrate 60 containing the memory peripheral circuitry, and may include multiple germanium layers. The low reverse breakdown voltage diode 72 is completely physically separated from the substrate 60.

Figure 17:
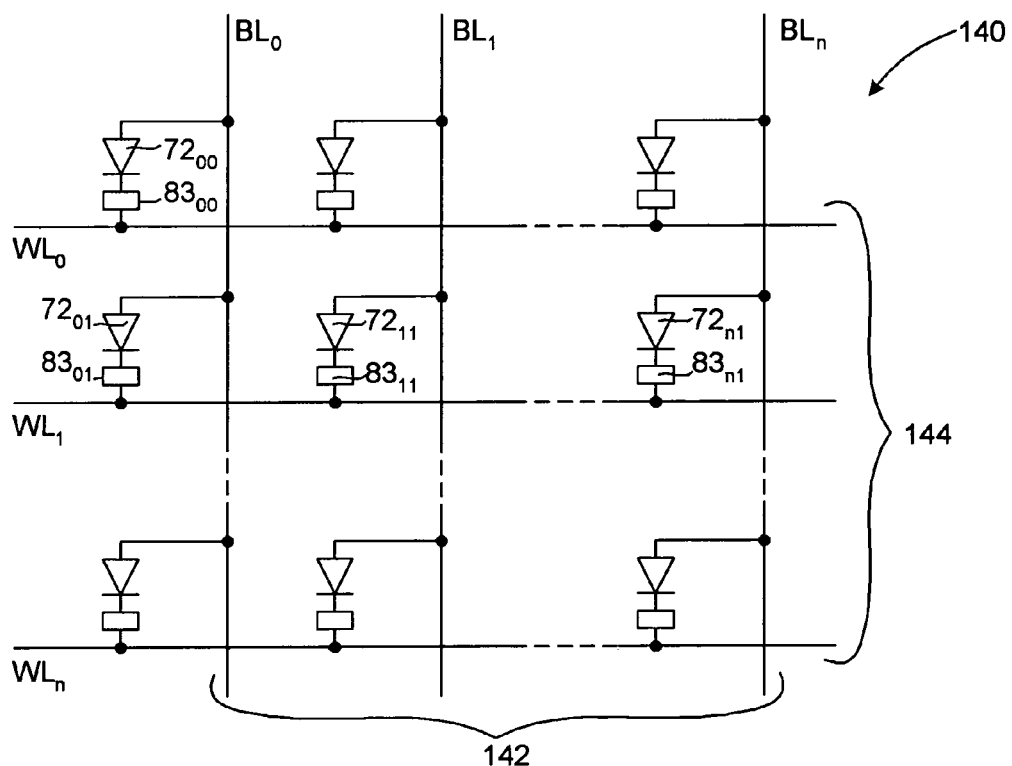
FIG. 17 is a schematic illustration of a memory array incorporating the present invention.

FIG. 17 illustrates a memory cell array 140 which incorporates structure of the type described above. As illustrated in FIG. 17, the memory cell array 140 includes a first plurality 142 of parallel conductors (bit lines) $BL_0, BL_1, \ldots BL_n$, and a second plurality 144 of parallel conductors (word lines) $WL_0, WL_1, \ldots WL_n$, overlying and spaced from, orthogonal to, and crossing the first plurality of conductors 142. A plurality of structures 160 as set forth above are included, each connecting a conductor BL with a conductor WL at the intersection thereof. Each structure includes a resistive memory device 83 and a diode 72 in series therewith, connected and configured as described above. For example, as shown in FIG. 17, memory device $83_{00}$ and diode $72_{00}$ in series connect conductor $BL_0$ of the first plurality of conductors 142 with conductor $WL_0$ of the second plurality of conductors 144 at the intersection of those conductors $BL_0$, $WL_0$, memory device $83_{10}$ and diode $72_{10}$ in series connect conductor $BL_1$ of the first plurality of conductors 142 with conductor $WL_0$ of the second plurality of conductors 144 at the intersection of those conductors $BL_1$, $WL_0$, etc. It will be seen that the above-described embodiment readily lends itself to efficient use in a memory cell array.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fabricating an electronic structure comprising;
    providing a diode comprising germanium;
    providing a barrier layer in contact with the diode; and
    providing a memory device connected to the diode through the barrier layer.

2. The method of claim 1 wherein the barrier layer is provided on one side of the diode, and further comprising providing an additional barrier layer on the other side of the diode.

3. The method of claim 2 wherein the barrier layers are in contact with the germanium.

4. The method of claim 3 wherein the barrier layers are conductive layers.

5. The method of claim 4 wherein the barrier layers are tungsten layers.

6. The method of claim 5 wherein the memory device is a resistive memory device.

7. A method of fabricating an electronic structure comprising;
    providing a substrate;
    providing a first barrier layer on the substrate;
    providing a germanium diode on the first barrier layer;
    providing a second barrier layer on and in contact with the germanium diode; and
    providing a memory device over and connected to the diode through the second barrier layer.

8. The method of claim 7 wherein the first and second barrier layers are tungsten barrier layers.

9. The method of claim 8 wherein the memory device is a resistive memory device.

10. An electronic structure comprising:
    a diode comprising germanium;
    a barrier layer in contact with the diode; and
    a memory device connected to the diode through the barrier layer.

11. The structure of claim 10 and further comprising a substrate, and an additional barrier layer between the diode and the substrate.

12. The structure of claim 11 wherein the barrier layers are in contact with the germanium.

13. The structure of claim 12 wherein the barrier layers are conductive layers.

14. The structure of claim 13 wherein the barrier layers are tungsten layers.

15. The structure of claim 14 wherein the memory device is a resistive memory device.

16. The structure of claim 15 wherein the memory device comprises a pair of electrodes, and active and passive layers between the electrodes.

17. A memory array comprising;
    a first plurality of conductors;
    a second plurality of conductors, and;
    a plurality of structures, each associated with a conductor of the first plurality thereof and a conductor of the second plurality thereof, each structure comprising;
        a germanium diode;
        a barrier layer in contact with the diode; and
        a memory device connected to the diode through the barrier layer.

18. The memory array of claim 17 wherein each memory device is a resistive memory device.

* * * * *